(12) United States Patent
Koizumi et al.

(10) Patent No.: US 7,061,361 B2
(45) Date of Patent: Jun. 13, 2006

(54) CIRCUIT BOARD ASSEMBLY AND FLAT COIL

(75) Inventors: Haruo Koizumi, Kawasaki (JP); Makoto Onozawa, Kawasaki (JP)

(73) Assignee: Fujitsu Hitachi Plasma Display Limited, Kawasaki (JP)

( * ) Notice: Subject to any disclaimer, the term of this patent is extended or adjusted under 35 U.S.C. 154(b) by 0 days.

(21) Appl. No.: 10/768,066

(22) Filed: Feb. 2, 2004

(65) Prior Publication Data

US 2004/0178876 A1    Sep. 16, 2004

(30) Foreign Application Priority Data

Mar. 11, 2003  (JP) .............................. 2003-065391

(51) Int. Cl.
*H01F 5/00*  (2006.01)
(52) U.S. Cl. .................. 336/200; 361/709; 361/719
(58) Field of Classification Search .................. 336/55, 336/62, 65, 200, 232; 361/701–722
See application file for complete search history.

(56) References Cited

U.S. PATENT DOCUMENTS

| | | | |
|---|---|---|---|
| 5,828,353 A | 10/1998 | Kishi et al. | |
| 5,973,923 A * | 10/1999 | Jitaru | 361/704 |
| 5,985,414 A | 11/1999 | Fukuda et al. | |
| 6,175,500 B1 * | 1/2001 | Roy | 361/719 |
| 6,222,733 B1 * | 4/2001 | Gammenthaler | 361/705 |
| 6,518,868 B1 * | 2/2003 | Miller et al. | 336/55 |

FOREIGN PATENT DOCUMENTS

| | | |
|---|---|---|
| JP | 5-304764 | 11/1993 |
| JP | 2002-280230 | 9/2002 |
| JP | 2002-319519 | 10/2002 |
| WO | 02/071422 A1 | 9/2002 |

OTHER PUBLICATIONS

Office Action issued in corresponding Taiwanese Application dated Jan. 10, 2005.

* cited by examiner

*Primary Examiner*—Tuyen T Nguyen
(74) *Attorney, Agent, or Firm*—Staas & Halsey LLP (57) ABSTRACT

A circuit board assembly has a flat coil element mounted on a circuit board so that an electric power loss is not generated even when the flat coil element is mounted to the circuit board together with a circuit part having a large heat sink. A module mounted on the circuit board has an electronic circuit device and a heat radiator attached to the electronic circuit device. The heat radiator has an extending part protruding from the electronic circuit device and extending parallel to a surface of the circuit board. A coil mounting area provided with no pattern wire is formed in a part of the circuit board facing the extending part. The flat coil element is mounted parallel to the circuit board in a state where a coil part of the flat coil element faces the coil mounting area.

10 Claims, 7 Drawing Sheets

CIRCUIT BOARD ASSEMBLY AND FLAT COIL

BACKGROUND OF THE INVENTION

1. Field of the Invention

The present invention generally relates to circuit board assemblies and, more particularly, to a circuit board assembly having a flat coil which forms an inductor.

2. Description of the Related Art

There is a circuit board assembly, as a drive circuit for a plasma display, which has a drive IC and peripheral circuit elements mounted to a single circuit board. Each of display elements of the plasma display is regarded as a capacitor when considered as a load, and charge and discharge are carried out when applying a voltage to each display element (capacitor) to perform a display. An electric power released from each display element when discharging is recovered through an inductor, and the recovered electric power is accumulated in a capacitor provided separately so as to use the accumulated electric power for charging a next display element (capacitor). That is, an electric power to each display element is recovered and reused through an inductor.

There is a flat coil element as the inductor used for the above-mentioned application. Such a flat coil element is a coil having a flat shape produced by laminating conductive wire layers and insulating layers according to a method for producing a printed wiring board, and a coil part formed in each layer is connected by vias (refer to Japanese Patent Laid-Open Patent Application No. 2002-280230)

Since the coil is formed in a flat shape, a magnetic field is generated in a direction perpendicular to a flat plane of the flat coil element. Therefore, in many cases, the flat coil element is mounted perpendicular to a circuit board in an upright state so that the magnetic field generated by the flat coil element is not influenced by pattern wirings of the circuit board.

On the other hand, there is suggested a method of mounting a transformer having a flat coil element to a circuit board in parallel. In such a method, a flat transformer formed by combining flat coils is connected to an edge of a circuit board so that the flat transformer is not overlapped with the circuit board (refer to Japanese Laid-Open Patent Application No. 5-304764).

Figure 1:
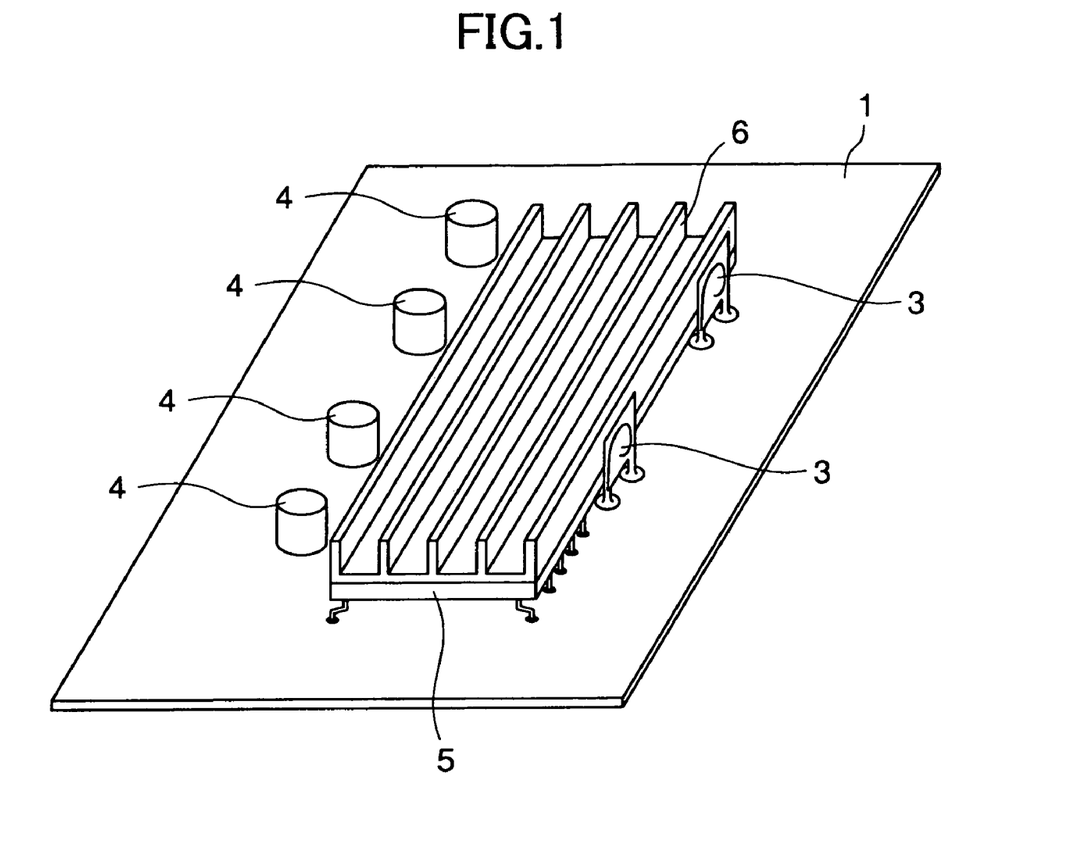
FIG. 1 is a perspective view of a circuit bard assembly constituting a drive circuit of a plasma display.

In the above-mentioned circuit board assembly constituting a drive circuit for a plasma display, other circuit elements are mounted in the periphery of the drive IC. FIG. 1 is a perspective view of a circuit bard assembly constituting a drive circuit of a plasma display. In the circuit board assembly shown in FIG. 1, a power module 2, which is a drive IC, is mounted onto a circuit board 1, and other circuit elements are mounted in the periphery of the power module 2.

Generally, a flat coil element 3 is arranged on a load side, that is, an output side of the circuit board 1, and a large component part such as a capacitor 4 is arranged on an input side. Generally, the flat coil element 3 is mounted to the circuit board 1 so that a flat surface of the element is perpendicular to the circuit board 1 so as to miniaturize the circuit board 1 by reducing a mounting area on the circuit board 1. Additionally, since the power module 2 has a highly integrated drive IC 5 that generates a large amount of heat, a heat sink 6 as a heat radiator is provided to the circuit board 1.

In the above-mentioned circuit board assembly shown in FIG. 1, if the amount of heat generated by the power module 2 is increased with high-integration, a distance between the heat sink 6 and the flat coil element 3 is decreased. Since the flat coil element 3 generates a magnetic field, a part of the heat sink 6 is located in the magnetic field generated by the flat coil element 3 if the heat sink 6 is located in the vicinity of the flat coil element. The heat sink 6 is made of metal such as, for example, aluminum, and, thus, an eddy current may be generated in the heat sink 6 if the magnetic field generated by the flat coil element 3 is applied to the heat sink 6. Such an eddy current generates a loss of an electric power to be recovered by an electric current recovery circuit including the flat coil element 3.

Moreover, an eddy current is generated in a wiring layer and an electric power loss is generated even in a case where the flat coil element 3 is mounted onto the circuit board 1 in parallel but close to it since the wiring layer (pattern wiring) of the circuit board 1 is made of metal.

SUMMARY OF THE INVENTION

It is a general object of the present invention to provide an improved and useful circuit board assembly in which the above-mentioned problems are eliminated.

A more specific object of the present invention is to provide a circuit board assembly which has a flat coil element mounted on a circuit board so that an electric power loss is not generated even when the flat coil element is mounted to the circuit board together with a circuit part having a large heat sink.

In order to achieve the above-mentioned objects, there is provided according to one aspect of the present invention a circuit board assembly comprising: a circuit board; a module mounted on the circuit board and having an electronic circuit device and a heat radiator attached to the electronic circuit device; and a flat coil element, wherein the heat radiator has an extending part protruding from the electronic circuit device and extending parallel to a surface of the circuit board; a coil mounting area provided with no pattern wire is formed in a part of the circuit board facing the extending part; and the flat coil element is mounted parallel to the circuit board in a state where a coil part of the flat coil element faces the coil mounting area.

According to above-mentioned invention, the magnetic field generated by the flat coil element is not influenced by the pattern wire in the circuit board even if the flat coil element is arranged under the extending part of the heat radiator in a state where the flat coil element is parallel to the circuit board. Accordingly, the flat coil element can be arranged under the extending part of the heat radiator, which results in an efficient use of an area of the circuit board. Therefore, there is no need to enlarge the circuit board even if the heat radiator is enlarged so as to increase a heat-radiating area, and the circuit board assembly having component parts efficiently mounted thereon can be achieved.

In the above-mentioned invention, the coil mounting is preferably an opening formed by removing a part of the circuit board. Additionally, a distance between the extending part of the heat radiator and the flat coil element is preferably set to a distance at which no eddy current is generated within the extending part due to a magnetic field generated by the flat coil element. Alternatively, an opening may be provided in a portion of the extending part of the heat radiator, the portion facing the flat coil element.

Additionally, the present invention is preferably applicable to a circuit board assembly in which the module is a power module for driving a plasma display, and the flat coil element provides an inductance used for recovering an electric power of the plasma display. The extending part of the heat radiator preferably extends on an output side of the power module.

Additionally, there is provided according to another aspect of the present invention a flat coil comprising: a coil part formed by a pattern wire provided on each layer of a multi-layer substrate, wherein the coil part is electrically connected to a corresponding terminal by a conductive part extending in a direction of thickness of the multi-layer substrate, and the coil part of each layer is configured and arranged to be electrically connectable to the coil part of another layer by short-circuiting the terminals.

Further, there is provided according to another aspect of the present invention a flat coil comprising: a coil part formed on each of an uppermost layer and a lowermost layer of a multi-layer substrate, wherein the coil part is electrically connected to a corresponding terminal by a conductive part extending in a direction of thickness of the multi-layer substrate, and the coil part of each layer is configured and arranged to be electrically connectable to the coil part of another layer by short-circuiting the terminals.

According to the flat coil of the above-mentioned invention, a number of turns of the coil can be changed even after the flat coil is produced by short-circuiting the terminals serving as intermediate terminals if needed.

Additionally, there is provided according to another aspect of the present invention a circuit board assembly comprising: a circuit board; a module mounted on the circuit board and having an electronic circuit device and a heat radiator attached to the electronic circuit device; and the above-mentioned flat coil, wherein the heat radiator has an extending part protruding from the electronic circuit device and extending parallel to a surface of the circuit board, and the flat coil is mounted in an area facing the extending part of the heat radiator. An opening may be provided in a portion of the extending part of the heat radiator, the portion facing the flat coil element.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of several embodiments of the present invention.

Figure 2:
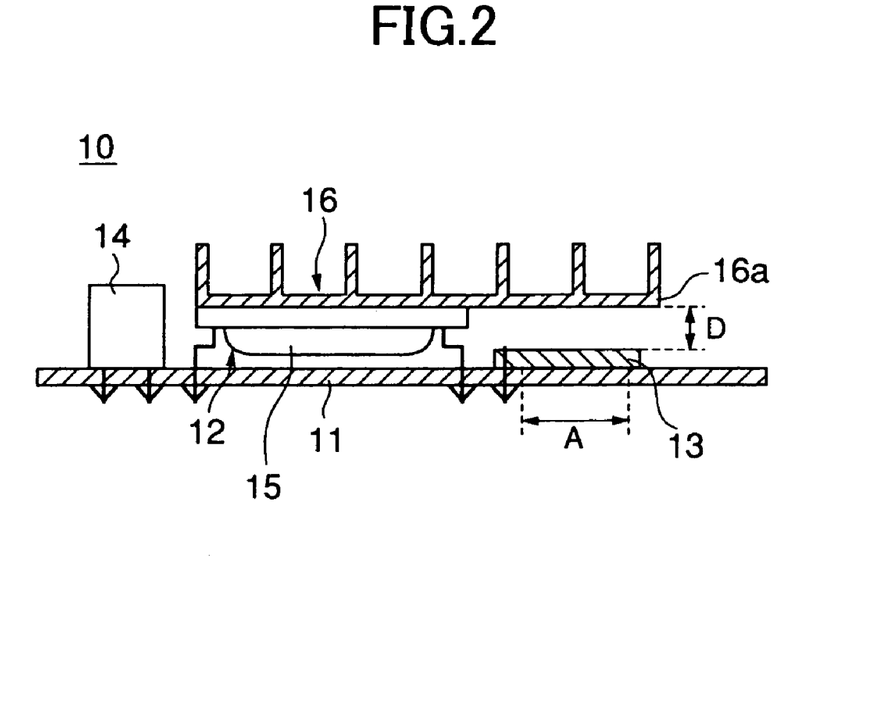
FIG. 2 is a cross-sectional view of a circuit board assembly according to a first embodiment of the present invention.

First, a description will be given, with reference to FIG. 2, of a first embodiment of the present invention. FIG. 2 is a cross-sectional view of a circuit board assembly 10 according to the first embodiment of the present invention. The circuit board assembly 10 according to the first embodiment of the present invention constitutes a drive circuit for driving a plasma display. The circuit board assembly 10 comprises a circuit board 11, which has a circuit pattern previously formed of copper foil or the like, and a power module 12 mounted to the circuit board 11. Circuit elements including a flat coil element 13 and a capacitor 14 for electric current recovery are arranged around the power module 12.

The power module 12 has a drive IC 15, which is a semiconductor device (an electronic circuit device) for driving a plasma display. Since the drive IC 15 is highly integrated and generates heat during an operation, the drive IC is provided with a heat sink 16 as a heat radiator made of metal such as aluminum or the like. An amount of heat generated by the drive IC 15 is increased with the high-integration of the drive IC 15, the size of the heat sink 16 has become still larger. In the present embodiment, the plane size of the drive IC 15 is larger than the plane size of the power module 12, and the heat sink 16 has an extending part 16a protruding from the drive IC 15 in parallel to the circuit board 15.

Large circuit parts such as a capacitor 14 and the like are arranged on the input side (left side in FIG. 2) of the power module 12. On the other hand, the flat coil element 13 for current recovery is preferably arranged at a position as close to the load (the plasma display) as possible, and, thus, the flat coil element 13 is arranged on the output side of the power module 12.

When the heat sink 16 has the same size as the drive IC 15, that is, the above-mentioned protruding part 16a is not provided, the flat coil element 13 can be mounted to the circuit board 11 by being arranged perpendicular to the output side of the power module 12. However, when the heat sink 16 is enlarged and the protruding part 16a is formed, a distance between the flat coil element 13 and the drive IC 15 must be large so as to mount the flat coil element 13 in the perpendicular state. Moreover, it will be in a state where the protruding part 16a of the metal heat sink 16 is located in the vicinity of the coil portion of the flat coil element 13, which results in generation of an eddy current within the protruding part 16a due to a magnetic field generated by the flat coil element 13.

Thus, in the present embodiment, the flat coil element 13 is arranged and mounted on the circuit board 11 under the extending part 16a of the heat sink 16 in a state where the flat coil element 13 is laid on the circuit board 11. Under such a condition, a part of the circuit board 11 is located in the vicinity of the coil part of the flat coil element 13. Although a metal pattern wire is formed on the circuit board 11, the part close to the coil part of the flat coil element 13 is set as an area (coil mounting area) in which the pattern wire is not formed. Thereby, an electric power loss due to an eddy current flowing through the pattern wire, which is caused by a magnetic field generated by the flat coil element 13, is prevented.

Additionally, a distance b between the flat coil element 13 and the extending part 16a of the heat sink 16 extending above the flat coil element 13 is set so that an eddy current does not flow in the extending part due to the magnetic field of the flat coil element 13 or the eddy current is negligibly small if it is generated.

As mentioned above, in the circuit board assembly 10 according to the present embodiment, the area of the circuit board 11 can be efficiently used by arranging the flat coil element 13 under the extending part 16a in a laid state. Therefore, if a heat radiating area is increased by enlarging the heat sink 16, there is no need to enlarge the circuit board 11, thereby achieving the circuit board assembly that efficiently mounts component parts.

Figure 3:
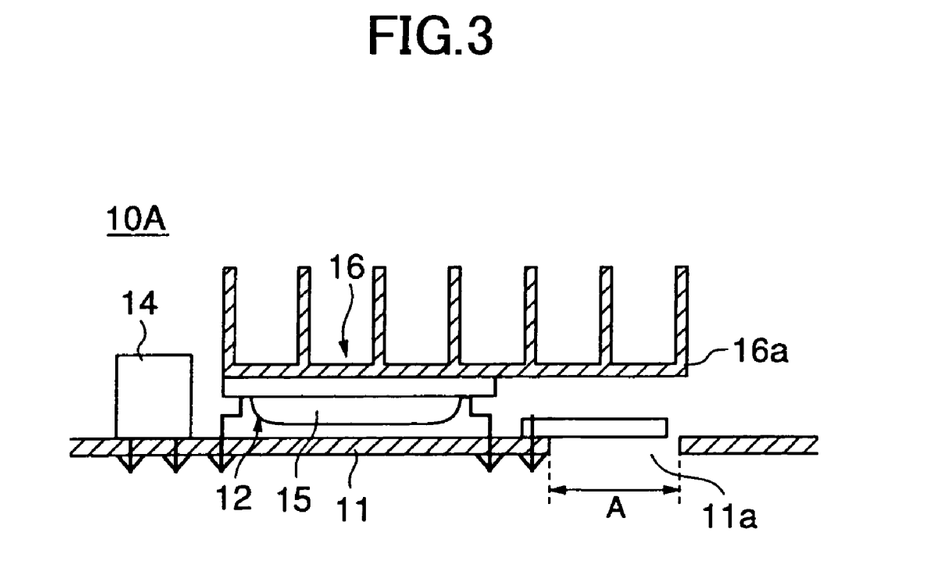
FIG. 3 is a cross-sectional view of a circuit board assembly according to a second embodiment of the present invention.

A description will now be given, with reference to FIG. 3, of a second embodiment of the present invention. FIG. 3 is a cross-sectional view of a circuit board assembly 10A according to the second embodiment of the present invention. In FIG. 3, parts that are the same as the parts shown in FIG. 2 are given the same reference numerals, and descriptions thereof will be omitted.

The circuit board assembly 10A shown in FIG. 3 has the same structure as the above-mentioned circuit board assembly 10 except for an opening part 11a formed in the circuit board 11. The opening part 11a is formed in a position corresponding to the mounting area A of the circuit board 11 in the above-mentioned circuit board assembly 10. Additionally, the opening part 11a has a size which substantially involves the magnetic field formed by the coil part of the flat coil element 13.

For example, if the pattern wire is not formed in the mounting area A of the circuit board A, there is a case where a power source layer or a grounding layer is provided in the mounting area A. Additionally, some materials of the circuit board 11 may give influences to the magnetic field generated by the flat coil element 13. Thus, in the present embodiment, the opening part 11a is formed in the mounting area A of the circuit board 11 where the magnetic field is generated by the flat coil element 13 so as to prevent the circuit board 11 from influencing the function of the flat coil element 13.

Figure 4:
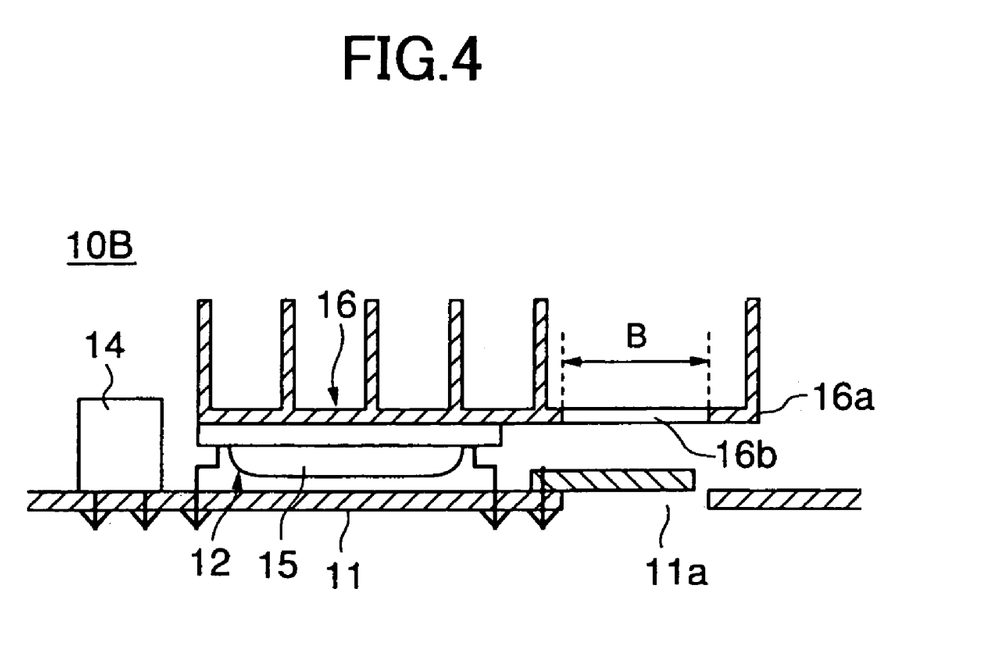
FIG. 4 is a cross-sectional view of a circuit board assembly according to a third embodiment of the present invention.

A description will now be given, with reference to FIG. 4, of a third embodiment of the present invention. FIG. 4 is a cross-sectional view of a circuit board assembly 10B according to the third embodiment of the present invention. In FIG. 4, parts that are the same as the parts shown in FIG. 3 are given the same reference numerals, and descriptions thereof will be omitted.

The circuit board assembly 10B shown in FIG. 4 has the same structure as the above-mentioned circuit board assembly 10A except for an opening part 16b formed in the extending part 16a of the heat sink 16. The opening 16b is provided directly above the coil part of the flat coil element 13, and has a size which substantially involves the magnetic field formed by the coil part of the flat coil element 13.

The present embodiment is effective especially when a large distance cannot be set to the distance D between the flat coil element 13 and extending part 16a of the heat sink 16. That is, the opening part 16b is formed so as to eliminate an area in which an eddy current is generated in a case where a considerable eddy current flows in the extending part 16a due to the magnetic field generated by the coil part of the flat coil element 13. It is sufficient that the opening 16b is provided only in the area directly above the coil part of the flat coil element 13, and, thus, the heat-radiating area of the heat sink 16 reduced by the formation of the opening part 16b is small.

As mentioned above, according to the present embodiment, there is no material in which an eddy current is generated in the vicinity of both sides of the flat coil element 13, and, thus, the flat coil element 13 can be located on the circuit board 11 without generation of an electric power loss. It should be noted that although both the opening 11a of the circuit board 11 and the opening part 16b of the heat sink 16 are provided in the present embodiment, only the opening part 16b may be provided to the heat sink 16 without forming the opening part 11a in the circuit board 11 if there is little influence of the circuit board 11.

Although the present invention is applied to the circuit board assembly for driving the plasma display in the above-mentioned embodiments, the present invention is not limited to such an application and is applicable to a circuit board assembly provided with electronic circuit devices that generate heat in operation.

Moreover, although the flat coil element 13 is mounted onto the circuit board 11 in the above-mentioned first to third embodiments, the coil part of the flat coil element 13 may be formed by being incorporated into the circuit board 11. That is, the coil part is formed at an appropriate position when forming the circuit board 11. The flat coil element 13 can be formed by a method of forming pattern wires within a general circuit board, and, thus, if it is possible when forming the circuit board 11, the coil part can be formed simultaneously when forming the pattern wire within the circuit board 11.

A brief description will now be given of a structure of the flat coil element 13 used in the above-mentioned embodiments. As mentioned above, the flat coil element 13 can be formed using a manufacturing method of a general circuit board. It should be noted that the coil part described below can also be formed in a state where the coil part is previously incorporated into the above-mentioned circuit board 11.

Figure 5:
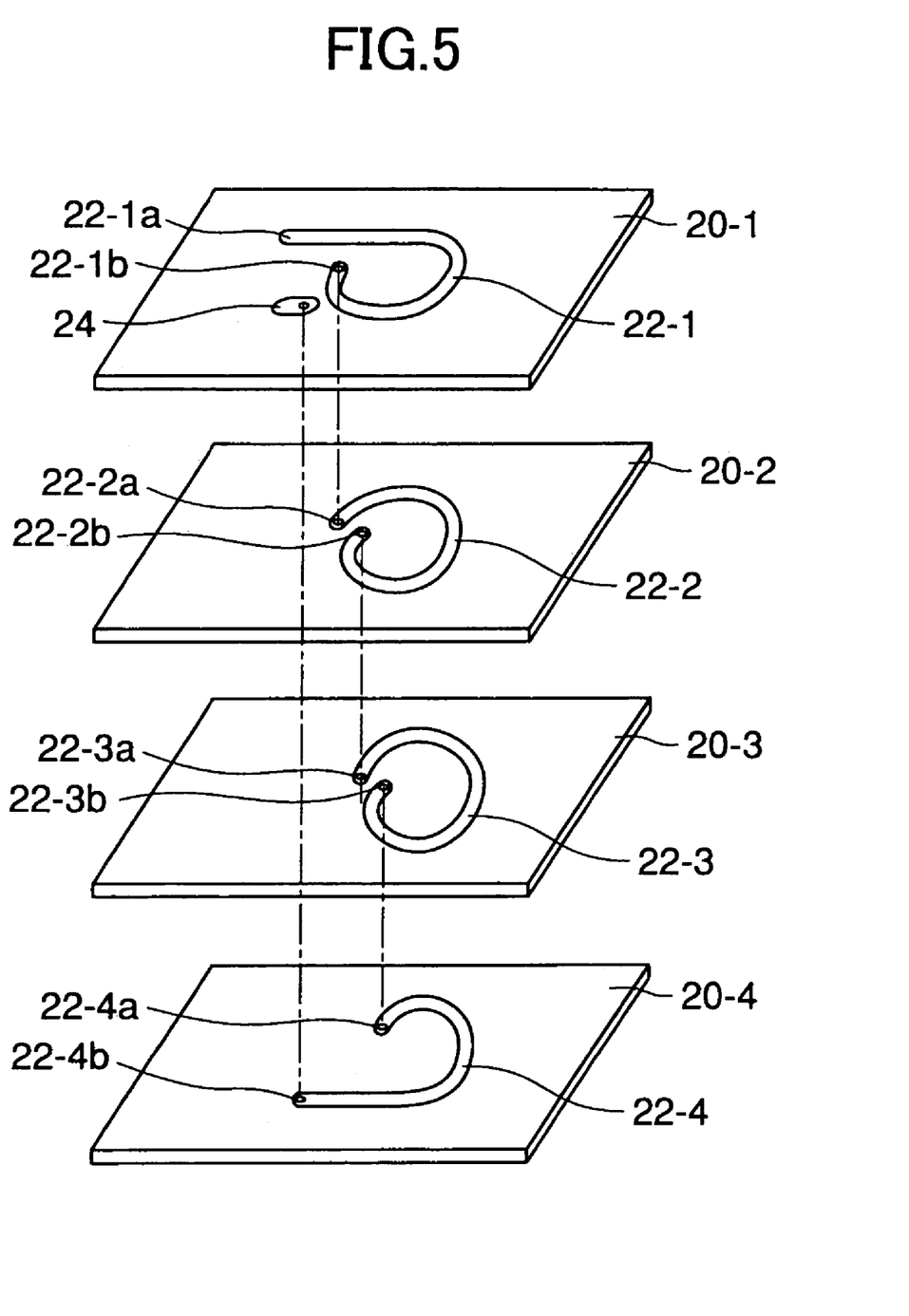
FIG. 5 is an exploded perspective view of a coil part formed in a multi-layer substrate.

The flat coil element 13 is provided with coil-like pattern wires formed in a board material, and is also provided with terminals for mounting. FIG. 5 is an exploded perspective view showing a structure of the coil part formed in a multi-layer substrate (four layers in FIG.>5).

A coil part 22-1 corresponding to about one turn is formed on a first layer 20-1 of the multi-layer substrate by pattern wiring. Here, an end 22-1a of the coil part 22-1 is formed so as to serve as a terminal. Additionally, a terminal 24, which serves as another terminal of the flat coil element 13, is also formed on the first layer 20-1 by pattern wiring.

A coil part 22-2 corresponding to about one turn is formed on a second layer 20-2 of the multi-layer substrate by pattern wiring. Here, an end 22-2a of the coil part 22-2 formed on the second layer 20-2 is electrically connected to the other end 22-1b of the coil part 22-1 formed on the first layer through a via or the like as indicated by a dotted line in FIG. 5.

Additionally, a coil part 22-3 corresponding to about one turn is formed on a third layer 20-3 of the multi-layer substrate by pattern wiring. Here, an end 22-3a of the coil part 22-2 formed on the third layer 20-3 is electrically connected to the other end 22-2b of the coil part 22-2 formed on the second layer through a via or the like as indicated by a dotted line in FIG. 5.

Similarly, a coil part 22-4 corresponding to about one turn is formed on a fourth layer 20-4 of the multi-layer substrate by pattern wiring. Here, an end 22-4a of the coil part 22-3 formed on the fourth layer 20-4 is electrically connected to the other end 22-3b of the coil part 22-3 formed on the third layer through a via or the like as indicated by a dotted line in FIG. 5. The other end 22-4a of the coil part 22-4 is electrically connected to the terminal 24 formed on the first layer 20-1 by a via or the like as indicated by a dotted line in FIG. 5.

As mentioned above, the coil having about four turns can be formed using a conventional manufacturing method of a circuit board. Moreover, a coil having an arbitrary number of turns can be formed by adding the structure of the second layer or the third layer.

Although a coil having the structure shown in FIG. 5 is formed as a coil which generates a magnetic field in a direction perpendicular to the surface of the substrate, a coil which generates a magnetic field in a direction parallel to the surface of the substrate, that is, a coil having a coil axis parallel to the surface of the substrate can also be formed by using a multi-layer substrate.

Figure 6:
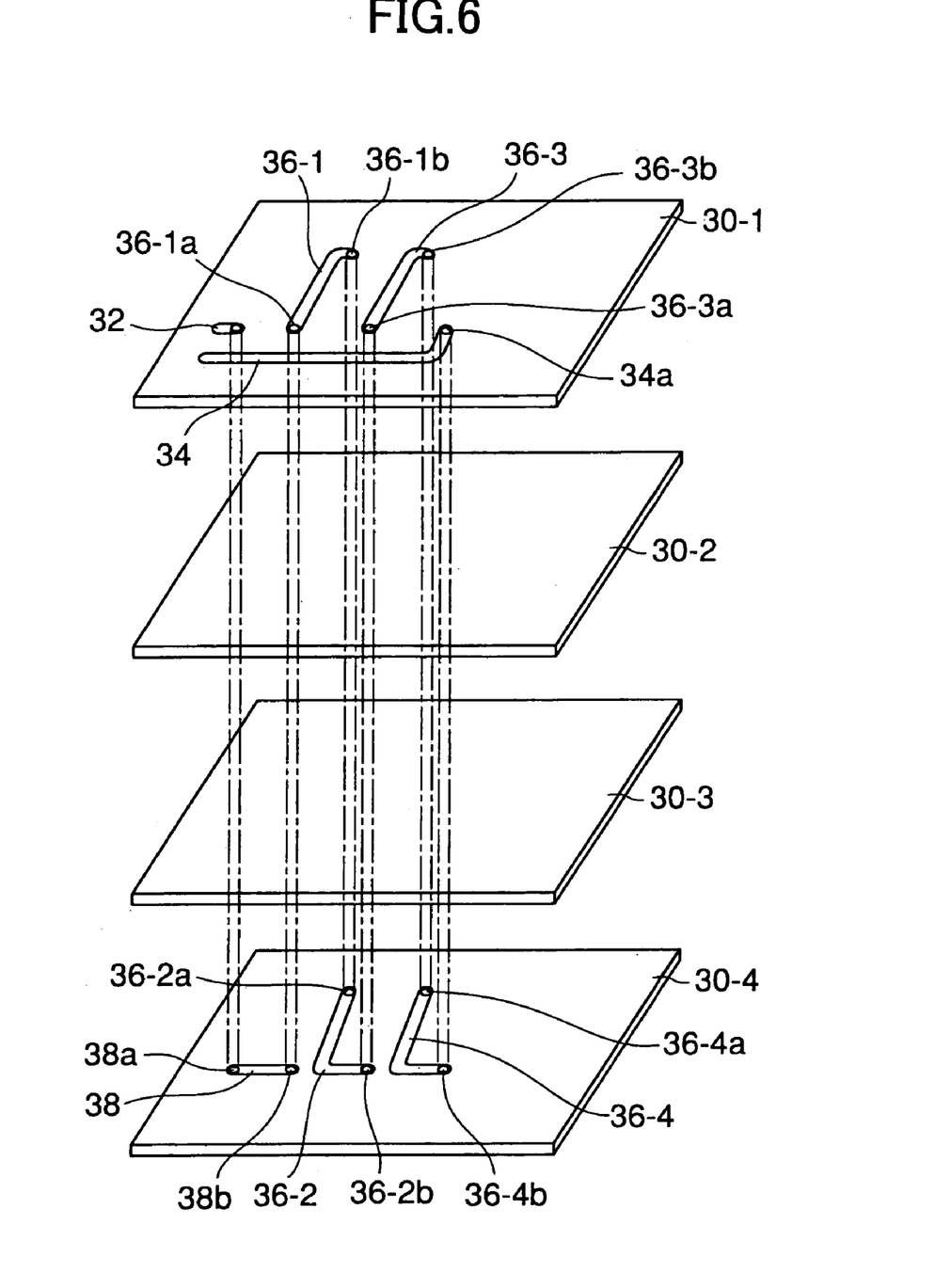
FIG. 6 is a perspective view showing a structure of a coil, which generates a magnetic field in a direction parallel to a surface of a substrate.

FIG. 6 is a perspective view showing a structure of a coil which generates a magnetic field in a direction parallel to a surface of a substrate.

Terminals 32 and 34 serving as opposite ends of the coil are formed on a first layer 30-1 as an uppermost layer by pattern wiring. Additionally, coil parts 36-1 and 35-3, each of which serves as a part of each turn of the coil, are formed on the uppermost layer 30-1 by pattern wiring.

As mentioned later, only vias are formed in a second layer 30-2 and a third layer 30-3 that serve as intermediate layers, and a pattern wire serving as a part of the coil is not formed on the second and third layers 30-2 and 30-3.

Coil parts 36-2 and 36-4 are formed on a fourth layer 30-4 serving as a lowermost layer by pattern wiring. Additionally, terminal connection part 38 is also formed on the lowermost layer 30-4. An end 38a of the terminal connection part 38 is electrically connected to the terminal 32 of the first layer 30-1 through a via as indicated by dotted lines in FIG. 6. The other end 38b of the terminal connection part 38 is electrically connected to an end 36-1a of the coil part 36-1 of the first layer 30-1 through a via as indicated by dotted lines in FIG. 6.

An end 36-2a of the coil part 36-2 of a fourth layer 30-4 is electrically connected to the other end 36-1b of the coil part 36-1 of the first layer 30-1 through a via as indicated by dotted lines in FIG. 6. The other end 36-2b of the coil part 36-2 is electrically connected to the end 36-3a of the coil part 36-3 of the first layer 30-1 through a via as indicated by dotted lines in FIG. 6.

Moreover, an end 36-4a of a coil part 36-4 of the fourth layer 30-4 is electrically connected to other ends 36-3b of the coil section 36-3 of the first layer 30-1 through a via as indicated by dotted lines in FIG. 6. The other end 36-4b of the coil part 36-4 is electrically connected to an end 34a of the terminal part 34 of the first layer 30-1 through a via as indicated by a via as indicated by dotted lines in FIG. 6.

In the above-mentioned structure, a coil having about two turns is formed by the coil parts 36-1, 36-2, 36-3 and 36-4 and the vias that perpendicularly connect the coil parts. It should be noted that although the second and the third layers are provided as intermediate layers in the present embodiment, the number of intermediate layers is not limited to two and an arbitrary number of intermediate layers may be provided. Additionally, a coil having an arbitrary number of turns can be formed by increasing the number of coil parts formed on the uppermost layer and the lowermost layer.

Figure 7:
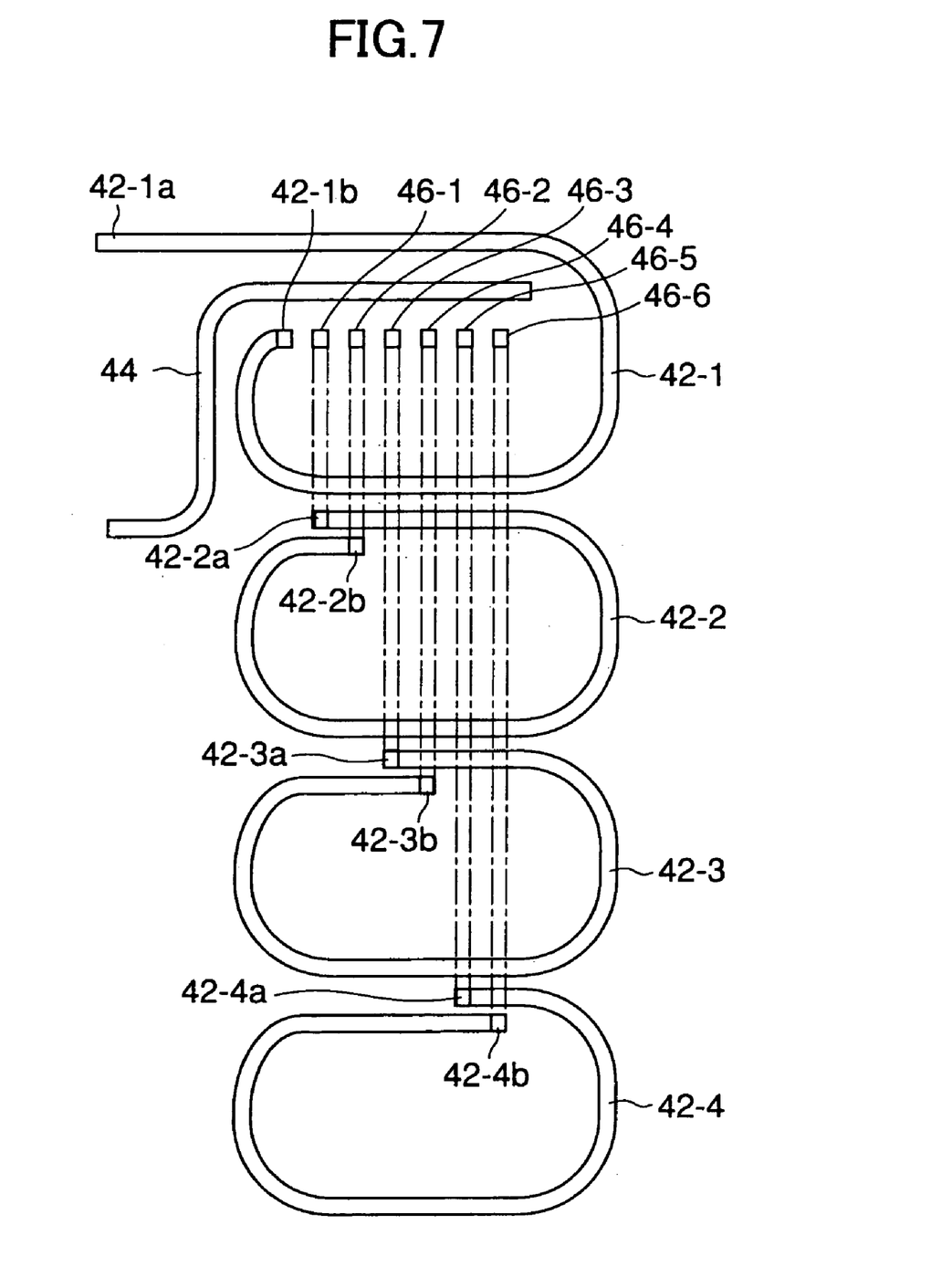
FIG. 7 is an illustration showing a structure in which a number of turns is adjustable in a coil having the structure shown in FIG. 5.

A description will now be given of a structure of the coil shown in FIG. 5 where the number of turns is adjustable. FIG. 7 is an illustration showing a structure in which a number of turns is adjustable in the coil having the structure shown in FIG. 5.

In FIG. 7, a coil part 42-1 and a terminal part 44 are formed in a first layer serving as an uppermost layer. Additionally, intermediate terminals 46-1 to 46-6 as additional terminals are formed on the first layer. An end 42-1a of the coil part 42-1 serves as a terminal of the coil. The intermediate terminals 46-1 to 46-6 are arranged close to and along the terminal part 44 starting from the other end 42-1b of the coil part 42-1.

The intermediate terminal 46-1 is electrically connected to an end 42-2a of a coil part 42-2 of a second layer through a via, and the intermediate terminal 46-2 is electrically connected to the other end 42-2b of the coil part 42-2 of the second layer through a via. Additionally, the intermediate terminal 46-3 is electrically connected to an end 42-3a of a coil part 42-3 of a third layer through a via, and the intermediate terminal 46-4 is electrically connected to the other end 42-3b of the coil part 42-3 of the third layer through a via. Similarly, the intermediate terminal 46-5 is electrically connected to an end 42-4a of a coil part 42-4 of fourth layer through a via, and the intermediate terminal 46-6 is electrically connected to the other end 42-4b of the coil part 42-4 of the fourth layer through a via.

In the above-mentioned structure, a coil having about one turn can be formed by the coil part 42-1 by electrically connecting the other end 32-1b of the coil part 42-1 to the terminal part 44 by short-circuiting. Additionally, a coil having about two turns can be formed by the coil parts 42-1 and 42-2 by electrically connecting the other end 32b of the coil part 42-1 to the intermediate terminal 26-1 by short circuiting and also electrically connecting the intermediate terminal 46-2 to the terminal part 44 by short-circuiting.

Further, a coil having about three turns can be formed by the coil parts 42-1, 42-2 and 42-3 by electrically connecting the other end 32-1b of the coil part 42-1 to the intermediate terminal 26-1 by short-circuiting, electrically connecting the intermediate terminal 46-2 to the intermediate terminal 46-3 by short-circuiting, and electrically connecting the intermediate terminal 46-4 to the terminal part 44 by short-circuiting.

Similarly, a coil having about four turns can be formed by the coil parts 42-1, 42-2, 42-3 and 42-4 by electrically connecting the other end 32-1b of the coil part 42-1 to the intermediate terminal 26-1 by short-circuiting, electrically connecting the intermediate terminal 46-2 to the intermediate terminal 46-3 by short-circuiting, electrically connecting the intermediate terminal 46-4 to the intermediate terminal 46-5 by short-circuiting, and electrically connecting the intermediate terminal 46-6 to the terminal part 44 by short-circuiting.

As mentioned above, by providing the intermediate terminals (terminal parts) 46-1 to 46-6 and short-circuiting them if necessary, a number of turns of a coil can be changed after a flat coil element is produced. Also in such a case, a coil having an arbitrary number can be formed by increasing a number of layers provided with coils and increasing a number of intermediate terminals, and a number of turns of the coil can be changed arbitrarily.

Figure 8:
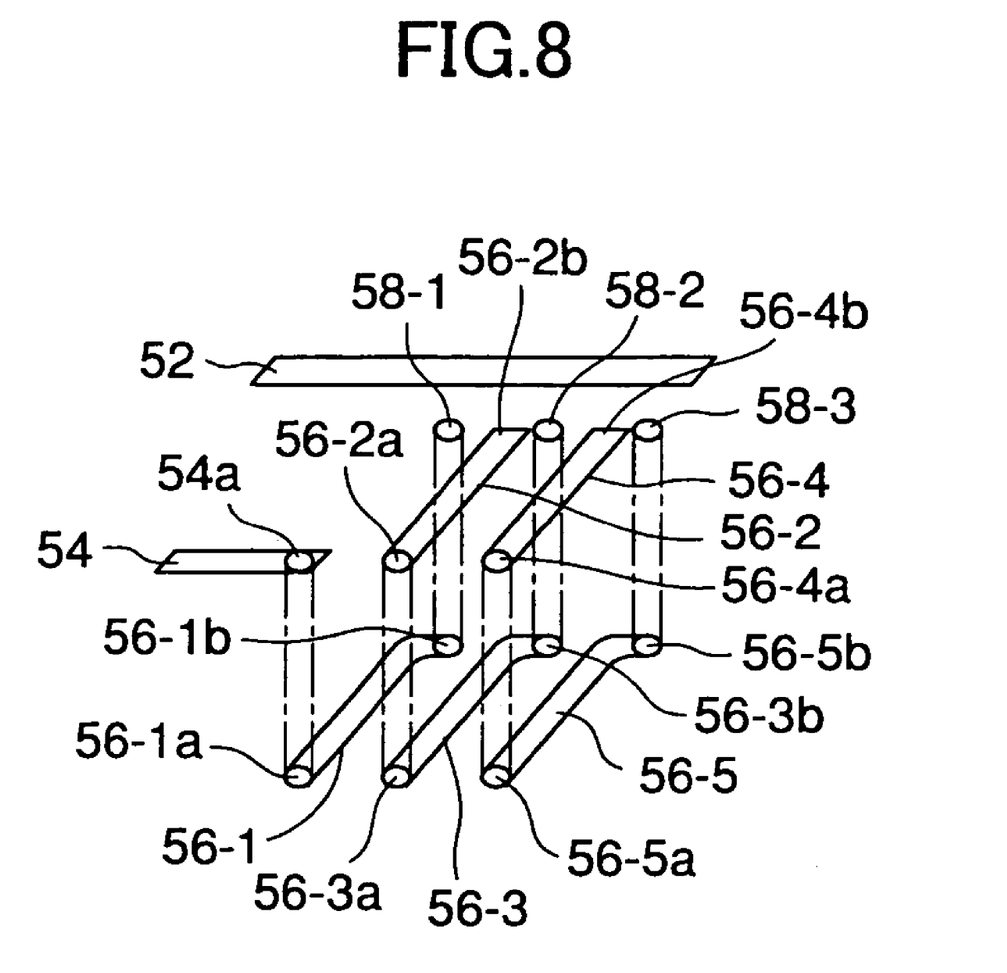
FIG. 8 is a perspective view showing a structure in which a number of turns is adjustable in a coil having the structure shown in FIG. 6.

A description will now be given of a structure in which a number of turns is adjustable in a coil having the structure shown in FIG. 6. FIG. 8 is a perspective view showing a structure in which a number of turns is adjustable in a coil having the structure shown in FIG. 6.

Terminal parts 52 and 54, coil parts 56-2 and 56-4, intermediate terminals 58-1 to 58-3 as additional terminals are formed on an uppermost layer. Coil parts 56-1, 56-3 and 56-5 are formed on a lowermost layer.

An end 54a of the terminal part 54 of the uppermost layer is electrically connected to an end 56-1a of the coil part 56-1 of the lowermost layer by a via, and the other end 56-1b of the coil part 56-1 is electrically connected to the intermediate terminal 58-1 of the uppermost layer by a via. Additionally, an end 56-2a of the coil part 56-2 of the uppermost layer is electrically connected to an end 56-3a of the coil part 56-3 of the lowermost layer by a via, and the other end 56-3b of the coil part 56-3 is electrically connected to the intermediate terminal 58-2 of the uppermost layer by a via. Similarly, an end 56-4a of the coil part 56-4 of the uppermost layer is electrically connected to an end 56-5a of the coil part 56-5 of the lowermost layer by a via, and the other end 56-5b of the coil part 56-5 is electrically connected to the intermediate terminal 58-3 of the uppermost layer by a via.

In the above-mentioned structure, a coil having about 0.5 turns can be formed by the coil part 56-1 by electrically connecting the intermediate terminal 58-1 to the terminal part 52 by short-circuiting. Additionally, a coil having about 1.5 turns can be formed by the coil parts 56-1, 56-2 and 56-3 by electrically connecting the intermediate terminal 58-1 to the other end 56-2b of the coil part 56-2 by short-circuiting and electrically connecting the intermediate terminal 58-2 to the terminal part 52 by short-circuiting. Further, a coil having about 2.5 turns can be formed by the coil parts 56-1, 56-2, 56-3, 56-4 and 56-5 by electrically connecting the intermediate terminal 58-1 to the other end 56-2b of the coil part 56-2 by-short-circuiting, electrically connecting the intermediate terminal 58-2 to the other end 56-4b of the coil part 56-4 by short-circuiting, and electrically connecting the intermediate terminal 58-3 to the terminal part 52 by short-circuiting.

As mentioned above, by providing the intermediate terminals (terminal parts) 58-1 to 58-3 and short-circuiting them if necessary, a number of turns of the coil can be changed after the flat coil element is produced. Also in such a case, a coil having an arbitrary number can be formed by increasing a number of layers provided with coils and increasing a number of intermediate terminals, and a number of turns of the coil can be changed arbitrarily.

The present invention is not limited to the specifically disclosed embodiments, and variations and modifications may be made without departing from the scope of the present invention.

The present application is based on Japanese priority application No. 2003-65391 filed Mar. 11, 2003, the entire contents of which are hereby incorporated by reference.

What is claimed is:

1. A circuit board assembly comprising:
   a circuit board;
   a module mounted on the circuit board and having an electronic circuit device and a heat radiator attached to the electronic circuit device; and
   a flat coil element,
   wherein said heat radiator has an extending part protruding from said electronic circuit device and extending parallel to a surface of said circuit board;
   a coil mounting area provided with no pattern wire is formed in a part of said circuit board facing the extending part; and
   said flat coil element is mounted parallel to said circuit board in a state where a coil part of said flat coil element faces said coil mounting area.

2. The circuit board assembly as claimed in claim 1, wherein said coil mounting area is an opening formed by removing a part of said circuit board.

3. The circuit board assembly as claimed in claim 1, wherein a distance between said extending part of said heat radiator and said flat coil element is set to a distance at which no eddy current is generated within said extending part due to a magnetic field generated by said flat coil element.

4. The circuit board assembly as claimed in claim 1, wherein an opening is provided in a portion of said extending part of said heat radiator, the portion facing said flat coil element.

5. The circuit board assembly as claimed in claim 1, wherein said module is a power module for driving a plasma display, and said flat coil element provides an inductance used for recovering an electric power of the plasma display.

6. The circuit board assembly as claimed in claim 5, wherein said extending part of said heat radiator extends on an output side of said power module.

7. A circuit board assembly comprising:
   a circuit board;
   a module mounted on the circuit board and having an electronic circuit device and a heat radiator attached to the electronic circuit device; and
   a flat coil comprising a coil part formed by a pattern wire provided on each layer of a multi-layer substrate
   wherein the coil part is electrically connected to a corresponding terminal by a conductive part extending in a direction of thickness of said multi-layer substrate, and the coil part of each layer is configured and arranged to be electrically connectable to the coil part of another layer by short-circuiting the terminals, and
   wherein said heat radiator has an extending part protruding from said electronic circuit device and extending parallel to a surface of said circuit board, and said flat coil is mounted in an area facing said extending part of said heat radiator.

8. The circuit board assembly as claimed in claim 7, wherein an opening is provided in a portion of said extending part of said heat radiator, the portion facing said flat coil element.

9. A circuit board assembly comprising:
   a circuit board;
   a module mounted on the circuit board and having an electronic circuit device and a heat radiator attached to the electronic circuit device; and
   a flat coil comprising a coil part formed on each of an uppermost layer and a lowermost layer of a multi-layer substrate,
   wherein the coil part is electrically connected to a corresponding terminal by a conductive part extending in a direction of thickness of said multi-layer substrate, and the coil part of each layer is configured and arranged to be electrically connectable to the coil part of another layer by short-circuiting the terminals, and
   wherein said heat radiator has an extending part protruding from said electronic circuit device and extending parallel to a surface of said circuit board, and said flat coil is mounted in an area facing said extending part of said heat radiator.

10. The circuit board assembly as claimed in claim 9, wherein an opening is provided in a portion of said extending part of said heat radiator, the portion facing said flat coil element.

* * * * *

UNITED STATES PATENT AND TRADEMARK OFFICE
CERTIFICATE OF CORRECTION

| | |
|---|---|
| PATENT NO. | : 7,061,361 B2 |
| APPLICATION NO. | : 10/768066 |
| DATED | : June 13, 2006 |
| INVENTOR(S) | : Haruo Koizumi et al. |

It is certified that error appears in the above-identified patent and that said Letters Patent is hereby corrected as shown below:

Column 10, Line 22, after "substrate" insert --,--.

Signed and Sealed this

Ninth Day of January, 2007

JON W. DUDAS
*Director of the United States Patent and Trademark Office*